United States Patent [19]

Matsuda et al.

[11] 4,279,984

[45] Jul. 21, 1981

[54] POSITIVE RESIST FOR HIGH ENERGY RADIATION

[75] Inventors: Shunsuke Matsuda; Soji Tsuchiya; Masami Honma, all of Kawasaki; Gentaro Nagamatsu, Tokyo, all of Japan

[73] Assignees: Matsushita Electric Industrial Co., Ltd., Osaka; Fuji Chemicals Industrial Co., Ltd., Tokyo, both of Japan

[21] Appl. No.: 974,003

[22] Filed: Dec. 28, 1978

Related U.S. Application Data

[63] Continuation of Ser. No. 804,163, Jun. 6, 1977, abandoned.

[30] Foreign Application Priority Data

Jun. 16, 1976 [JP] Japan .................................. 51/71535

[51] Int. Cl.³ .......................... G03C 1/68; B05D 3/06; G03C 1/70; C08F 22/32
[52] U.S. Cl. .............................. 430/270; 204/159.14; 427/43.1; 427/44; 430/272; 430/296; 526/298; 526/304; 526/310
[58] Field of Search ................. 96/35.1, 115 R; 204/159.14; 427/43.1, 44; 526/310, 298, 304; 430/296, 270, 272

[56] References Cited

U.S. PATENT DOCUMENTS

| 3,897,295 | 7/1975 | Dowbenko et al. | 204/159.16 |
| 3,948,794 | 4/1976 | Konig | 526/311 |
| 3,984,582 | 10/1976 | Feder et al. | 96/35.1 |
| 4,011,351 | 3/1977 | Gipstein | 96/115 R |
| 4,024,293 | 6/1977 | Hatzakis | 96/115 R |

OTHER PUBLICATIONS

Canale et al., Journal of Applied Science, vol. IV, No. 11, pp. 231–236 (1960).
Kinsinger et al., Journal of Applied Science, vol. 9, pp. 129–137 (1965).

*Primary Examiner*—Jack P. Brammer
*Attorney, Agent, or Firm*—Stevens, Davis, Miller & Mosher

[57] ABSTRACT

A resist material used for forming a positive image by application of radiation, said material comprising as principal constituent poly(ethyl α-cyanoacrylate), poly(ethyl α-amidoacrylate) or a binary copolymer thereof or a ternary copolymer of poly(ethyl α-cyanoacrylate), poly(ethyl α-amidoacrylate) and polymethacrylonitrile. The minimum incident charge of radiation required for forming a desired resist pattern by use of this resist material is as low as $10^{-7}$ coulomb/cm², or far lower than the level required in use of other known resist materials, and a positive resist image which can well stand the chromium etching solutions is obtained by short-time irradiation.

5 Claims, 7 Drawing Figures

F I G. 5
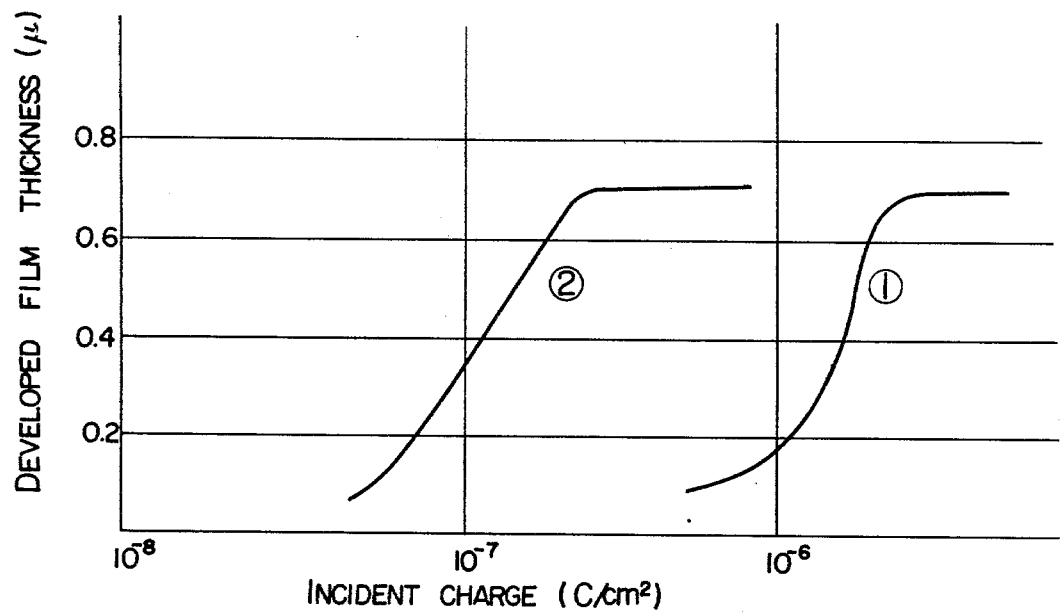
F I G. 6
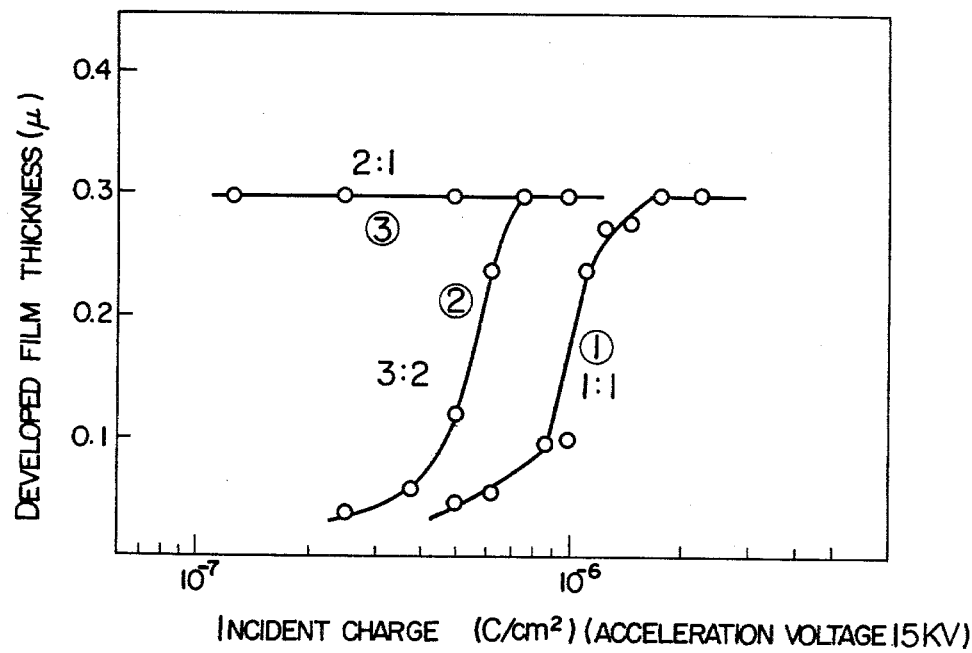

F I G. 7
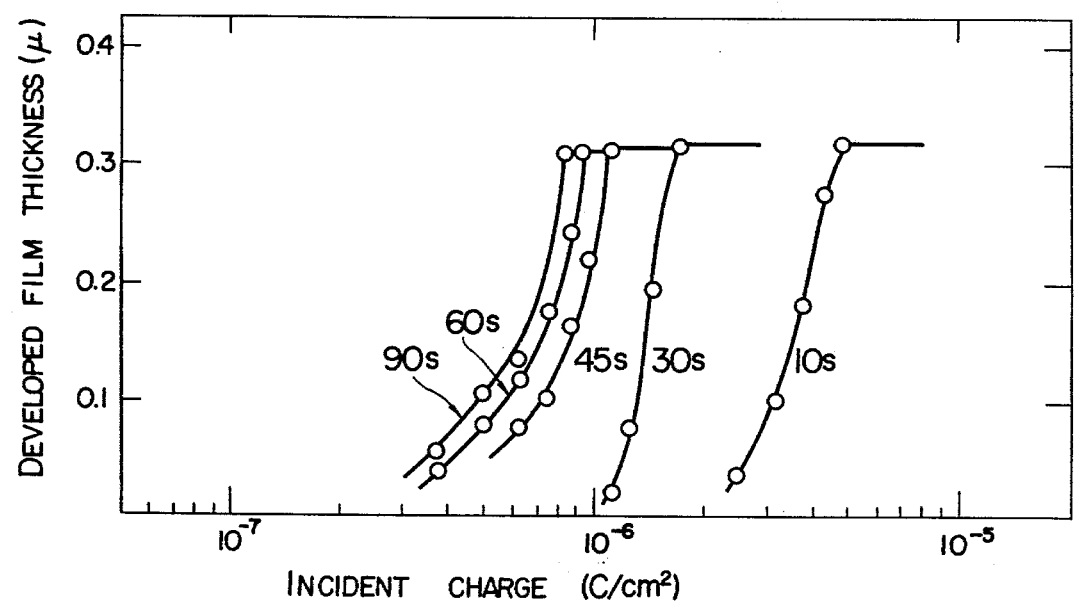

POSITIVE RESIST FOR HIGH ENERGY RADIATION

This is a continuation of application Ser. No. 804,163 filed June 6, 1977, now abandoned.

BACKGROUND OF THE INVENTION

This invention relates to a resist material used for forming a resist pattern by application of radiation such as electron beams, X-rays and ultraviolet rays.

In order to meet the rising request for higher integration capacity of the semiconductor integrated circuits in recent years, there has been proposed the etching method which is capable of forming a fine and minute pattern on the substrate by utilizing radiation of short wave length such as electron beams, X-rays and ultraviolet rays.

This invention is to provide a resist material used in such etching method utilizing radiations of said type, and more particularly the invention is intended to provide the above-said kind of positive resist material which can be solubilized in the developing solvent upon exposure to radiation.

Poly(methyl methacrylate) (hereinafter referred to as PMMA), crosslinked PMMA and polystyrene sulfone are known as typical examples of the positive type resist materials, but these materials are unsatisfactory in respect of sensitivity. For instance, the minimum incident charge of electron beams required for the irradiation is as high as $5 \times 10^{-5}$ Coulomb/cm$^2$ (hereinafter abbreviated as C/cm$^2$) in the case of PMMA, $0.8 \times 10^{-5}$ C/cm$^2$ in the case of crosslinked PMMA, and $1 \times 10^{-5}$ C/cm$^2$ in the case of polystyrene sulfone, and for drawing for example a 3-inch square mask pattern, it needed to apply fairly intense electron beams for a prolonged period of time which could amount to the order of days.

An object of this invention is to provide a resist material having sensitivity to radiation of the charge level which is one to two figures lower than that required in use of the conventional materials.

Another object of this invention is to provide a high-molecular weight resist material which can well stand use with the chromium etching solutions.

The resist material provided according to this invention comprises as principal constituent poly(ethyl α-cyanoacrylate), poly(ethyl α-amidoacrylate) or a binary copolymer thereof or a ternary copolymer composed of said two substances plus polymethacrylonitrile, and has sensitivity to the electron beams of the minimum incident charge of $5 \times 10^{-7}$ C/cm$^2$ or the X-rays or ultraviolet rays of the incident charge of the order of 20 mJ/cm$^2$. This resist material can also stand use with the chromium etching solutions.

SUMMARY OF THE INVENTION

According to the present invention, there is provided a resist material used for forming a positive image by application of radiation and comprising a polymer or copolymer including the following structural units:

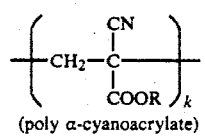

(poly α-cyanoacrylate)

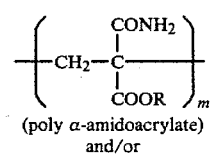

(poly α-amidoacrylate)

and/or

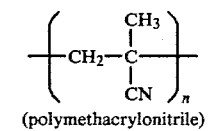

(polymethacrylonitrile)

(where R represents an alkyl group with 1 to 4 carbon atoms, and k, m and n represent respectively the degree of polymerization), wherein the molar ratio of (I):(II):(III) in said copolymer is 1.0 to 0.5:0 to 0.2:0 to 0.5.

The high-molecular weight compounds used as resist material of this invention can be synthesized by the methods shown in A. J. Canale et al: J. Appl. Polymer. Sci., 4, 231 (1960), and J. B. Kinsinger et al: J. Appl. Polymer. Sci., 9, 429 (1965). The high-molecular weight materials usable for making the resist according to this invention are those having the molecular weight of over 50,000 for allowing film formation, but it should be noted that if the molecular weight exceeds 1,000,000, it becomes difficult to obtain a good film. It is also desirable that such high-molecular weight materials have a narrow span of molecular weight distribution for providing high resolution.

In practical applications, the resist material of this invention is adapted as a film on a substrate. The process of producing such resist film as well as the process of forming a positive image from the produced resist film are now described with reference to the accompanying drawings.

BRIEF DESCRIPTION OF THE DRAWINGS

FIG. 5 shows the relationship between incident charge and developed film thickness when the resist film of this invention was irradiated with electron beams;

FIG. 6 shows the effect of the developing solution on the resist film of this invention; and FIG. 7 shows the effect of the developing time on the resist film of this invention.

DESCRIPTION OF THE PREFERRED EMBODIMENTS

The first step in the process of this invention is to form a resist film on the surface of a substrate to be etched which is made of a suitable material such as a semiconductor, metal or metal oxide. For forming a resist film from poly(ethyl α-cyanoacrylate), poly(ethyl α-amidoacrylate) or a binary copolymer thereof or a ternary copolymer of poly(ethyl α-cyanoacrylate), poly(ethyl α-amidoacrylate) and polymethacrylonitrile, said polymer or copolymer is dissolved in a soluble solvent such as acetone, cyclohexanone, tetrahydrofuran or acetic acid ester to prepare a solution with concentration of 3 to 10% by weight. This solution is passed through a microfilter to remove dust and other impurities and then applied on the substrate by the spin-coating method at speed 500 to 8,000 r.p.m. to form a resist film on the substrate. The thickness of the formed resist film varies depending on the solution concentration, molecular weight of the polymer or copolymer used, solution viscosity, spinning speed and other factors.

Figure 1:
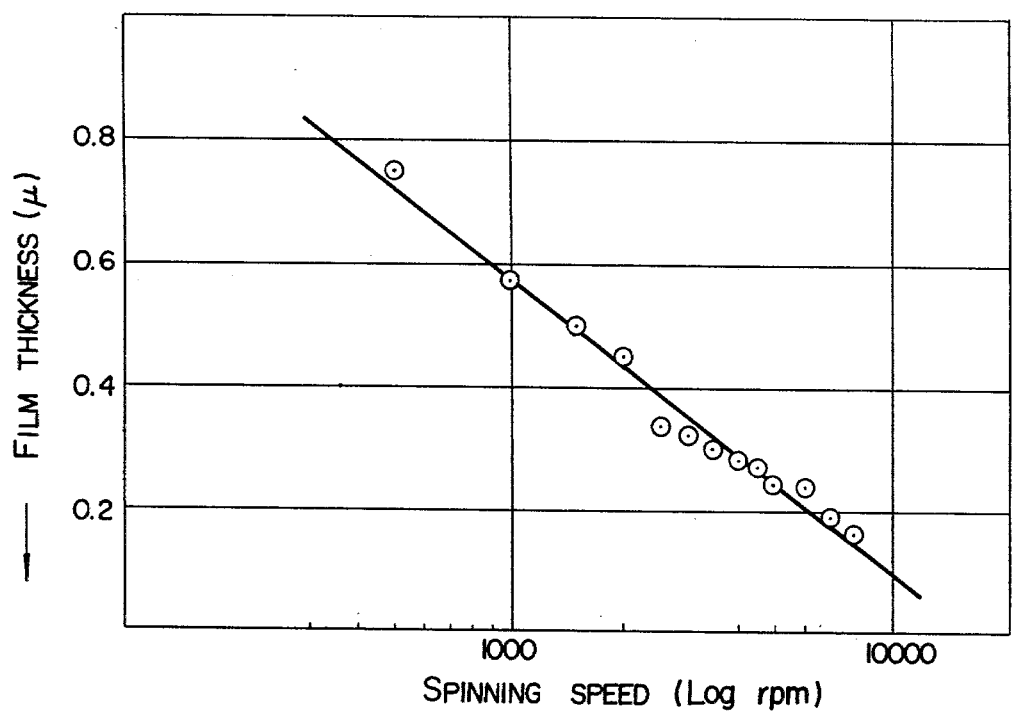
FIG. 1 is a diagram showing the relationship between spinning speed and formed film thickness in practice of spin-coating with the resist material of this invention.

FIG. 1 shows the relationship between resist film thickness and spinning speed in spin-coating with a solution prepared by dissolving 4% by weight of poly-(ethyl α-cyanoacrylate)

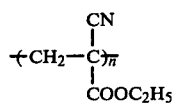

with molecular weight of approximately 200,000 in cyclohexane. As noted from FIG. 1, there can be obtained a resist film of poly(ethyl α-cyanoacrylate) with thickness of 0.75 μm when coating is performed at spinning speed of 500 r.p.m. and a resist film with thickness of 0.15 μm when the spinning speed is raised to 8,000 r.p.m. Thus, the higher the spinning speed, the thinner the film thickness.

The second step is to subject the thus formed resist film to a heating treatment (hereinafter referred to as prebaking) which is practiced prior to irradiation.

Figure 2:
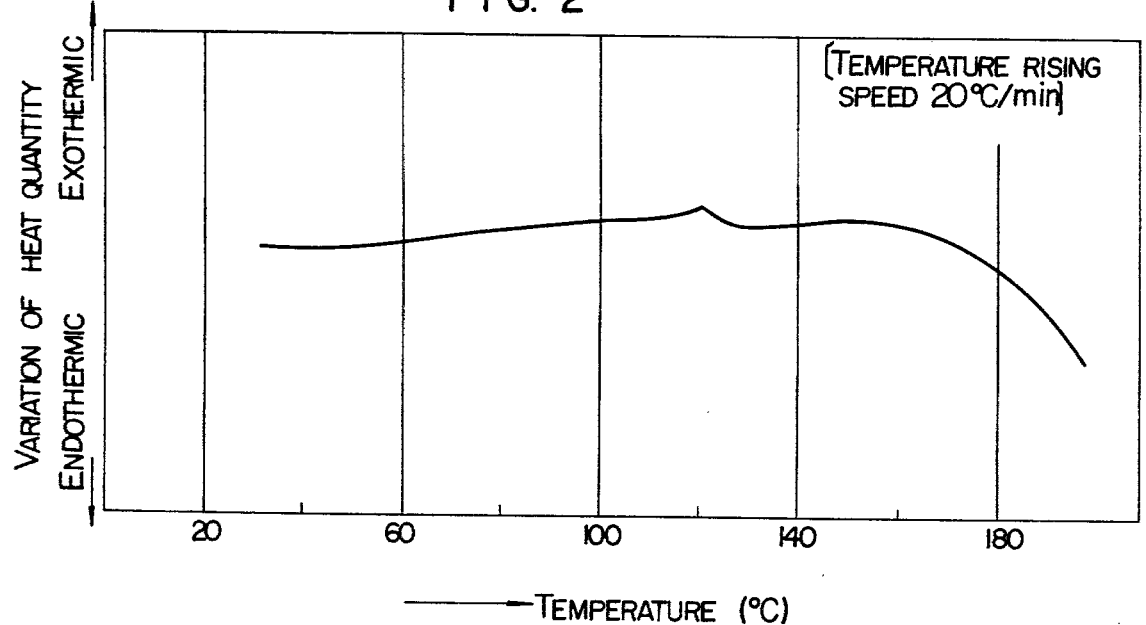
FIG. 2 shows DSC (differential scanning colorimether) photograph the resist according to this invention.

Prebaking is intended to remove the residual spinning solvent after formation of the resist film by spin-coating or other method, to eliminate film strain or to improve adhesion between the resist film and the substrate to be etched. Also, this prebaking, performed at a temperature above the glass transition temperature of the resist material and below the decomposition temperature thereof, can prevent the resist film from becoming liable to swell or separate by the action of the developing solution during the developing treatment described later. For instance, in the case of the afore-mentioned poly(ethyl α-cyanoacrylate), the glass transition begins at around 120° C. and the decomposition takes place at around 155° C. as shown in FIG. 2. Therefore, prebaking is preferably practiced at a temperature within the range of 120° to 150° C. About 15-minute prebaking is sufficient to provide the desired effect when such prebaking is performed for example at 130° C. The glass transition temperature of the polymer lowers as the chain length of the ester residue of poly(ethyl α-cyanoacrylate) increases (such chain length becomes greater in the order of methyl, ethyl, propyl and butyl), so that the prebaking temperature is also lowered accordingly.

Figure 3:
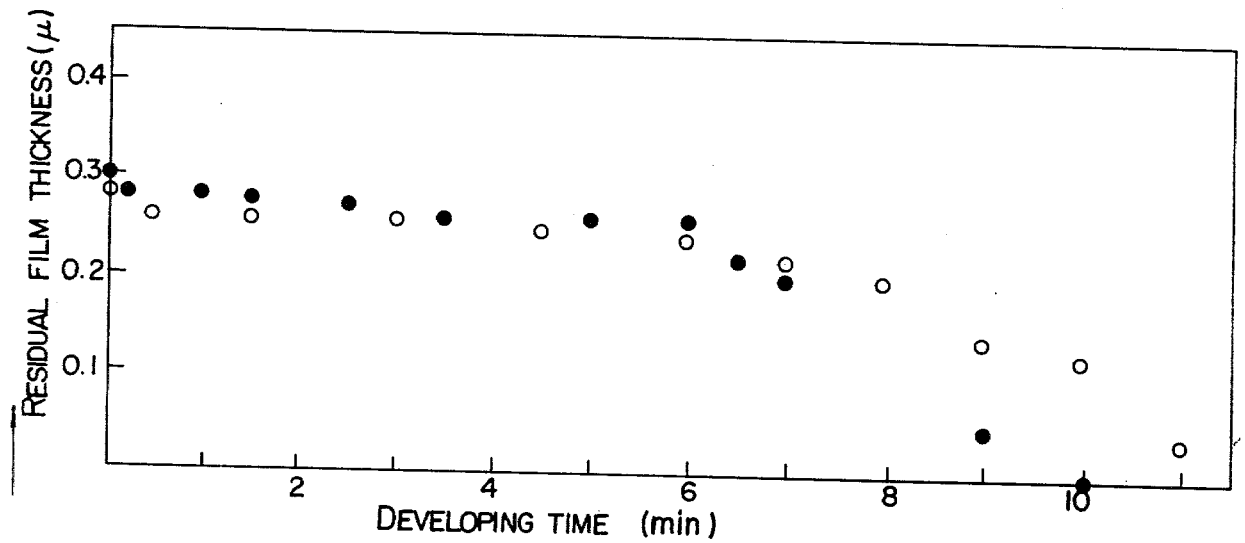
FIG. 3 is a diagram showing the patterns of variation of solubility of the resist film according to this invention as observed when said film was subjected to prebaking and when not subjected to prebaking.

FIG. 3 shows the patterns of variation of film solubility as observed when the resist film was subjected to prebaking and when not subjected to prebaking. The experiment was made by forming the resist films from poly(ethyl α-cyanoacrylate by using as solvent a 3:2 mixture of ethyl acetate and methyl isobutyl ketone. In the figure, black circles (●) represent the film which has been subjected to 15-minute prebaking at 130° C. and white circles (O) represent the film which was not subjected to prebaking. Both films show no noticeable sign of solubility when their contact time with the mixed solvent is less than 6 minutes, but when the contact time exceeds 6 minutes, the prebaked film comes to exhibit a dissolving tendency at increasing rates. Therefore, in use of the resist material of this invention, which is of the type in which the irradiated portion is removed, it needs to confine the developing time within 6 minutes. The resist material of this invention shows the characteristics quite analogous to those depicted in FIG. 3.

The third step in the process of this invention is to irradiate the resist film to form a latent image of etching pattern. In forming such latent image of etching pattern, the resist film may be scanned successively by, for example, the electron beams modulated in accordance with the pattern signal, or such successive scanning may be practiced with the electron beams of a predetermined beam current by using an electron beam shield plate bearing an etching pattern as mask. The required radiation charge is over $5 \times 10^{-7}$ C/cm$^2$ in the case of electron beams and over 20 mJ/cm$^2$ in the case of ultraviolet rays or X-rays.

Figure 4:
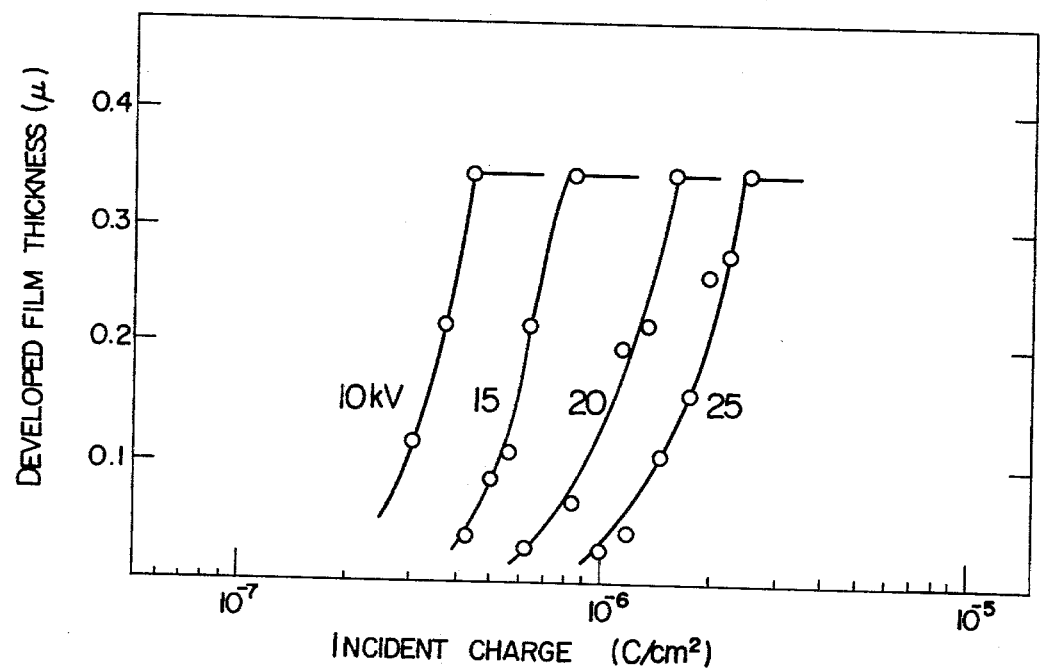
FIG. 4 shows the influence of accelerating voltage when the resist of this invention is irradiated with electron beams.

FIG. 4 shows the effect of accelerating voltage on the resist material of this invention. The resist material used in this experiment was the one formed from poly(ethyl α-cyanoacrylate) and prebaked at 130° C. for 15 minutes. In the figure, the numerical figures indicate the accelerating voltages (KV) of the electron beams, and the incident charge (Coulomb/cm$^2$) of electron beams is plotted along the abscissa and the developed film thickness (μm) obtained from 1-minute development at 25° C. with developing solution of a mixture of ethyl acetate and methyl isobutyl ketone in the ratio of 3:2 by volume is plotted along the ordinate. As noted from this figure, the smaller the accelerating voltage, the better the sensitivity. The conventional positive type resist materials are changed from positive type into negative type as the incident charge of electron beams increases, but the resist material of this invention undergoes no such change even if the incident charge of radiation increases.

The fourth step of this invention is the developing treatment in which the unnecessary portion of the resist film which has formed thereon a latent image of etching pattern by irradiation is dissolved away by a solvent. This developing treatment is accomplished by washing the resist film with an organic solvent or such. This treatment is based on the fact that the irradiated portion of the resist film undergoes molecular disintegration such as scission main chain in the molecular structure constituting the film to give rise to a difference in molecular weight between the irradiated and non-irradiated portions, resulting in a corresponding difference in solubility of said portions in the developing solution comprising organic solvents.

As the degree of molecular disintegration caused by irradiation on the resist film varies according to the incident charge of radiation, it needs to suitably change the developing conditions. Proper selection of the developing solution is also an important factor as solubility of the resist film changes depending on the kind of the developing solution used. Used as the solvent for the developing solution of the resist material of this invention is a mixture of a solvent well soluble to the resist material, such as acetone, ethyl acetate, cyclohexanone or tetrahydrofuran, and a solvent insoluble to the resist material, such as methyl isobutyl ketone, cyclohexane, n-hexane, methyl alcohol, ethyl alcohol or isopropyl alcohol, methyl cellosolve, ethyl cellosolve or ethyl cellosolve acetate. The developing time varies depending on the conditions of prebaking practiced for the purposes of improvement of resist film adhesion and solvent removal of the resist film, the kind of the developing solution used and the temperature thereof.

FIG. 5 shows the relationship between the incident charge of electron beams and the developed film thickness as determined by using a resist film formed from poly(ethyl α-cyanoacrylate) by performing prebacking at 130° C. for 15 minutes. "Developed film thickness" is the difference between the film thickness of the irradiated portion after development and that of the unirradiated portion. Curve (1) in the figure represents the results as obtained by developing said irradiated resist film for 3 minutes with a developing solution comprising a mixed solvent of cyclohexanone and methyl isobutyl ketone in the ratio of 1:3 by volume, and curve (2) represents the results as obtained from similar development with a developing solution comprising a mixed solvent of cyclohexanone and methyl isobutyl ketone in the ratio of 1:2 by volume. It is noted from FIG. 5 that the resist film with small incident charge of radiation can well be developed with a developing solution where the soluble solvent to insoluble solvent ratio is high.

FIG. 6 shows the influence of the developing solution on the resist film. The test was made by using the developing solutions prepared by mixing ethyl acetate and methyl isobutyl ketone in different ratios and performing the development at 25° C. for 1 minute. In FIG. 6, curve (1) represents the results obtained by using a developing solution prepared by mixing ethyl acetate and methyl isobutyl ketone in the ratio of 1:1 by volume, curve (2) represents the results from use of a developing solution prepared by mixing said solvents in the ratio of 3:2 by volume, and curve (3) represents the results from use of a developing solution where said solvents were mixed in the ratio of 2:1 by volume.

FIG. 7 shows the influence of the developing time on the resist film as determined by using a developing solution same as represented by (3) in FIG. 6 (a mixture of ethyl acetate with methyl isobutyl ketone in the ratio of 2:1 by volume) and developing the film at 25° C. The numerals in FIG. 7 indicate the developing time (sec). It is learned from this figure that even if the incident charge of radiation is small, satisfactory development can be accomplished by prolonging the developing time.

A sensitivity curve similar to curve (2) in FIG. 5 can be obtained when developing the resist film of FIG. 5 with a developing solution prepared by mixing ethyl acetate and methyl isobutyl ketone in the ratio of 1:2 by volume.

The developing treatment may be accomplished either by immersing the resist film in the developing solution or by spraying the developing solution from a nozzle, but for forming a minute pattern with high precision, it is desirable to supply always fresh developing solution over the film surface.

The fifth step is drying of the developed etching pattern. If the resist film is dried immediately after development, the resist material may be slightly left over on the exposed substrate surface. It is therefore recommended to perform drying after washing the film with a solvent which has good compatibility with the developing solution and which does not dissolve the resist material, such as for example methyl alcohol, ethyl alcohol, isopropyl alcohol, n-hexane, cyclohexane or methyl isobutyl ketone.

The final step is the baking treatment in which the resist film left on the substrate in correspondence to the etching pattern is made more insoluble in various kinds of solvents and etching solutions.

The present invention is now described in further detail by way of preferred embodiments thereof.

EXAMPLE 1

Poly(ethyl α-cyanoacrylate) having an average molecular weight of 200,000 was dissolved in cyclohexanone to the concentration of 10% by weight. Then chromium was evaporated to the thickness of 800 to 1200 Å on a glass plate and a 0.6 μm thick film was formed on the chromium layer by spin-coating at spinning speed of approximately 5,000 r.p.m. Thereafter, the film was subjected to a heat treatment at 130° C. for 15 minutes and then irradiated with electron beams at incident charge of $5 \times 10^{-7}$ C/cm$^2$ and accelerating voltage of 15 KV.

After irradiation, the film was taken out of the irradiator and immersed in a mixed solvent of cyclohexanone and methyl isobutyl ketone in the ratio of 1:2 by volume at 25° C. for 2 minutes, immediately followed by washing in isopropyl alcohol. The thus treated film was dried and then heated at 130° C. for 15 minutes, forming an etching mask having its irradiated portion recessed. The recession formed by $10^{-9}$ Å incident charge irradiation of 1000 Å wide beams had 2000 Å line width. The chromium on the substrate was etched by using this etching mask. The 800 Å chromium etching layer was etched by 2-minute etching with a chromium etching solution prepared by mixing 1 part by volume of an aqueous solution of 50 grams NaOH dissolved in 100 ml of water and 3 parts by volume of an aqueous solution of 100 grams of $K_3[Fe(CN)_6]$ in 300 ml of water. After washing with water and drying, the work was subjected to supersonic washing with ethyl acetate, whereby the poly(ethyl α-cyanoacrylate) film was removed. Further washing with isopropyl alcohol formed a pattern on the chromium deposit.

EXAMPLE 2

The same process as Example 1 was repeated except for irradiating far ultraviolet rays from a deuterium lamp at the incident charge of 20 mJ/cm$^2$ instead of the electron beams, obtaining the similar result to Example 1.

EXAMPLE 3

The process of Example 1 was repeated except for irradiating X-rays (Al, Kα) at the incident charge of 20 mJ/cm$^2$ instead of the electron beams, obtaining the similar result to Example 1.

EXAMPLE 4

Poly(ethyl α-cyanoacrylate) having an average molecular weight of 250,000 was dissolved in cyclohexanone to the concentration of 10% by weight, and a poly(ethyl α-cyanoacrylate) film having thickness of 6000 Å was formed on a glass substrate having a noncrystalline iron oxide layer of 3500 Å thickness thereon by the spin-coating method at spinning speed of approximately 5,000 r.p.m. This was followed by a 15-minute heat treatment at 130° C. and electron beam irradiation at incident charge of $7\times 10^{-7}$ C/cm$^2$ and accelerating voltage of 25 KV.

After irradiation, the film-formed substrate was immersed in a mixed solvent of ethyl acetate and cyclohexanone in the ratio of 2:1 by volume at 25° C. for 60 seconds, immediately followed by washing with ethyl alcohol and drying. Upon further 15-minute heating at 130° C., the irradiated portion was recessed to bare out the substrate, thus forming an etching mask. Then 2-minute etching was performed with a diluted hydrochloric acid (pH 3) through said etching mask, followed by sufficient washing with water and drying. The irradiated portion was transparent as its liverbrown iron oxide layer had been removed.

The mask film was further subjected to supersonic washing with ethyl acetate and additional washing with isopropyl alcohol. This treatment gave a pattern of iron oxide.

EXAMPLE 5

A cyclohexanone solution of 5% by weight of poly(ethyl α-amidoethylacrylate) having an average molecular weight of 250,000 was prepared. There was also prepared a substrate by forming a chromium layer having about 200 Å in thickness on a glass plate by evaporation and further depositing therein a gold layer having 1000 Å in thickness. After washing this substrate carefully so that no oil film was left thereon, the said poly(α-amidoethylacrylate) solution was spin-coated on this substrate at spinning speed of approximately 3000 r.p.m. to form a poly(ethyl α-amidoethylacrylate) film having 4000 Å in thickness. This was then subjected to a 15-minute heat treatment at 140° C. and electron beam irradiation at incident charge of $7\times 10^{-7}$ C/cm$^2$ with acceleration voltage of 10 KV. After irradiation, the work was immersed in ethyl acetate at 25° C. for 2 minutes, immediately followed by washing with isopropyl alcohol and drying. Upon further 15-minute heating at 140° C., the irradiated portion was recessed to bare out the substrate, thus forming an etching mask.

Gold etching was performed through this etching mask by using an etching solution prepared by dissolving 20 grams of potassium iodide and 5.0 grams of iodine in 250 ml of water. Gold was etched in about 15 seconds. Thereafter, the mssk material was removed by supersonic washing with ethyl acetate, followed by washing with isopropyl alcohol. There was consequently formed a gold pattern on chromium layer of 200 Å in thickness.

EXAMPLE 6

The process of Example 5 was followed except for irradiating far ultraviolet rays at the incident charge of 30 mJ/cm$^2$ instead of the electron beams, obtaining the similar result to Example 5.

EXAMPLE 7

The same process of Example 5 was repeated except for irradiating X-rays at the incident charge of 30 mJ/cm$^2$ instead of the electron beams, obtaining the similar result to Example 5.

EXAMPLE 8

A mask was formed according to the same process as Example 1 except for use of a chromium layer having 200 Å in thickness deposited on a glass plate same as used in Example 1. The resist layer was 4000 to 5000 Å in thickness. After formation of the mask, gold was evaporated over its entire surface to the thickness of approximately 1000 Å, followed by 5-minute supersonic washing with ethyl acetate and additional washing with isopropyl alcohol.

After drying, 40-second etching was performed with a chromium etching solution prepared by mixing 1 part by volume of an aqueous solution of 50 grams of NaOH dissolved in 100 ml of water and 3 parts by volume of an aqueous solution of 100 grams of K$_3$[Fe(CN)$_6$] dissolved in 300 ml of water, whereby the chromium layer on the substrate was removed and a gold pattern was formed on the glass plate.

EXAMPLE 9

The process of Example 1 was repeated except for using a copolymer composed of more than 90 mol % of α-cyanoethylacrylate and less than 10 mol % of α-amidoethylacrylate instead of the poly(α-cyanoethylacrylate) as resist material, obtaining the similar result to Example 1.

EXAMPLE 10

The process of Example 5 was repeated except for using a copolymer composed of less than 90 mol % of α-cyanoethylacrylate and more than 10 mol % of α-amidoethylacrylate instead of the poly(α-cyanoethylacrylate) as resist material, obtaining the result similar to that of Example 5.

EXAMPLE 11

A cyclohexanone solution of 7% by weight of ternary copolymer consisting of α-cyanoethylacrylate, α-amidoacrylate and methacrylonitrile (mixed in the molar ratio of 9:1:4) having an average molecular weight of about 200,000 obtained by radical polymerization in acetonitrile was spin-coated on the substrate to form a film having 500 Å in thickness. After heating (prebaking) at 140° C. for 15 minutes, the film was irradiated with electron beams at incident charge of $2\times 10^{-7}$ C/cm$^2$ and developed with a mixed solvent of ethyl acetate and ethyl cellosolve acetate in the ratio of 3:1 by volume at 25° C. for 1 minute, followed by washing with isopropyl alcohol. The portion irradiated with more than $2\times 10^{-7}$ C/cm$^2$ incident charge of electron beams was dissolved away.

Development with ethyl acetate alone provided sensitivity of higher than $5\times 10^{-8}$ C/cm$^2$, but the developing time became so short that control was difficult. Use of this ternary copolymer bettered heat resistance as compared with the case of using poly(ethyl α-cyanoacrylate) alone, and the decomposition temperature was around 180° C.

EXAMPLE 12

The process of Example 11 was repeated except for irradiating far ultraviolet rays at the incident charge of 20 mJ/cm$^2$ instead of the electron beams, obtaining the similar result in Example 11.

EXAMPLE 13

The same process as Example 11 was repeated except for irradiating X-rays in the incident amount of 20 mJ/cm$^2$ instead of the electron beams, obtaining the similar result to Example 11.

What is claimed is:

1. A positively imaged resist film, said film consisting essentially of a polymer selected from the group consisting of (A) a homopolymer consisting of structural units of the formula

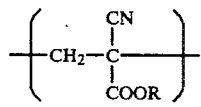 (I), (B) a homopolymer consisting of structural units of the formula

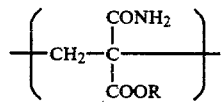 (II), (C) a copolymer of (I) and (II) and
(D) a terpolymer consisting of units (I) and (II) and

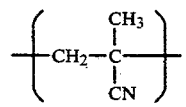 (III)

(where R represents an alkyl group with 1 to 4 carbon atoms), wherein the molar ratio of (I):(II):(III) in said copolymer or terpolymer is 1.0 to 0.5:0 to 0.2:0 to 0.5 and wherein the average molecular weight is 50,000 to 1,000,000.

2. A resist film according to claim 1 consisting essentially of poly(ethyl α-cyanoacrylate).

3. A resist film according to claim 1 consisting essentially of poly(ethyl α-amidoacrylate).

4. A resist film according to claim 1 consisting essentially of a copolymer of α-cyanoethylacrylate and α-amidoethylacrylate.

5. A resist film according to claim 1 consisting essentially of a terpolymer of α-cyanoethylacrylate, α-amidoacrylate and methacrylonitrile.

* * * * *